US009019019B2

(12) United States Patent  
Alouini et al.

(10) Patent No.: US 9,019,019 B2  
(45) Date of Patent: Apr. 28, 2015

(54) OSCILLATOR FOR GENERATING A SIGNAL COMPRISING A TERAHERTZ-ORDER FREQUENCY USING THE BEAT OF TWO OPTICAL WAVES

(75) Inventors: Mehdi Alouini, Liffre (FR); Goulc'hen Loas, Saint Aubin D'aubigne (FR); François Bondu, Servon sur Vilaine (FR); Marc Vallet, Thorigne Fouillard (FR); Marc-Olivier Brunel, Rennes (FR); Marco Romanelli, Rennes (FR)

(73) Assignees: Universite de Rennes 1, Rennes (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/701,555

(22) PCT Filed: May 24, 2011

(86) PCT No.: PCT/EP2011/058450  
§ 371 (c)(1),  
(2), (4) Date: Feb. 14, 2013

(87) PCT Pub. No.: WO2011/151223  
PCT Pub. Date: Dec. 8, 2011

(65) Prior Publication Data  
US 2013/0141174 A1   Jun. 6, 2013

(30) Foreign Application Priority Data

Jun. 2, 2010   (FR) ...................................... 10 54281

(51) Int. Cl.  
*H03B 21/00* (2006.01)  
*H03B 17/00* (2006.01)  
(Continued)

(52) U.S. Cl.  
CPC ...... *H03B 17/00* (2013.01); *G02F 1/11* (2013.01); *H03B 21/02* (2013.01); *G02F 1/3534* (2013.01); *G02F 2203/13* (2013.01)

(58) Field of Classification Search  
CPC .................................. G02F 1/11; H03B 21/02  
USPC ........ 331/37, 42, 43; 359/287; 372/28, 21, 22  
See application file for complete search history.

(56) References Cited

U.S. PATENT DOCUMENTS 5,574,588 A   11/1996   Kawanishi et al.  
6,239,893 B1   5/2001   Bigo et al.  
(Continued)

OTHER PUBLICATIONS

"Impact of Non-Linear Transfer Function and Imperfect Splitting Ratio of MZM on Optical Up-Conversion Employing Double Sideband With Carrier Suppression Modulation", Lin et al, Journal of Lightwave Tech, vol. 26, No. 15, Aug. 1, 2008.*

(Continued)

*Primary Examiner* — Arnold Kinkead  
(74) *Attorney, Agent, or Firm* — Nixon & Vanderhye, PC

(57) ABSTRACT

The invention concerns an oscillator generating a wave composed of a frequency of on the order of terahertz from a beat of two optical waves generated by a dual-frequency optical source. The oscillator includes a modulator the transfer function of which is non-linear for generating harmonics with a frequency of less than one terahertz for each of the optical waves generated by the dual-frequency optical source, an optical detector able to detect at least one harmonic for each of the optical waves generated by the dual-frequency optical source and transforming the harmonics detected into an electrical signal, a phase comparator for comparing the electrical signal with a reference electrical signal, and a module for controlling at least one element of the dual-frequency optical source with a signal obtained from the signal resulting from the comparison.

13 Claims, 3 Drawing Sheets

(51) Int. Cl.
  *G02F 1/35* (2006.01)
  *G02F 1/11* (2006.01)
  *H03B 21/02* (2006.01)

(56) References Cited

U.S. PATENT DOCUMENTS 7,116,460 B2 * 10/2006 Griffin .................... 359/245
2013/0100973 A1 * 4/2013 Bondu et al. ............. 372/28

OTHER PUBLICATIONS

International Search Report for PCT/EP2011/058450, mailed Jul. 19, 2011.
Non-English Written Opinion for PCT/EP2011/058450, mailed Jul. 19, 2011.
Ruoso et al., "Nd:YAG laser frequency stabilization to a supercavity at the 0.1 Hz level", *Optics Communications*, vol. 133, No. 1, Jan. 1997, pp. 259-262.

* cited by examiner

OSCILLATOR FOR GENERATING A SIGNAL COMPRISING A TERAHERTZ-ORDER FREQUENCY USING THE BEAT OF TWO OPTICAL WAVES

This application is the U.S. national phase of International Application No. PCT/EP2011/058450 filed 24 May 2011 which designated the U.S. and claims priority to FR Patent Application No. 10/54281 filed 2 Jun. 2010, the entire contents of each of which are hereby incorporated by reference.

BACKGROUND OF THE INVENTION

The present invention concerns an oscillator generating a wave composed of a frequency on the order of terahertz from a stabilised beat of two optical waves generated by a dual-frequency optical source.

Generating and controlling terahertz (THz) waves is a field that at the present time is experiencing a regain in interest because of the progress in microelectronics and optics.

THz waves cover the electromagnetic spectrum lying between microwaves and the far infrared.

The applications sought are for example imaging, spectroscopy, the detection of chemical and biological species and the physics of phonon material and phonon light interactions.

Various techniques are currently used for generating THz waves.

The most widespread is based on the use of an impulse femtosecond laser associated with an antenna based on semiconductors wherein the life of the electrons is on the order of picosecond or on the use of an optical rectification crystal. The wave thus generated is spread over a spectral width that may be as much as a few THz. This technique does not make it possible to obtain a THz wave of high spectral purity.

Other techniques use techniques of multiple multiplications of a microwave frequency to reach a THz wave. These techniques are relatively complicated to implement.

SUMMARY OF THE INVENTION

The aim of the invention is to solve the drawbacks of the prior art by proposing a high spectral purity THz wave generator.

To this end, according to a first aspect, the invention proposes an oscillator generating a wave composed of a frequency on the order of terahertz from a beat of two optical waves generated by a dual-frequency optical source, characterised in that the oscillator comprises:
  a modulator the transfer function of which is non-linear for generating harmonics with a frequency of less than one terahertz for each of the optical waves generated by the dual-frequency optical source,
  an optical detector able to detect at least one harmonic for each of the optical waves generated by the dual-frequency optical source and to transform the harmonics detected into an electrical signal,
  a phase comparator for comparing the electrical signal with a reference electrical signal,
  means for controlling at least one element of the dual-frequency optical source with a signal obtained from the signal resulting from the comparison.

Thus, by creating a feedback loop in the oscillator, it is possible to precisely control the frequency of at least one of the optical waves generated by the oscillator. It is then possible to obtain a high spectral purity THz wave generator.

By inserting a modulator the transfer function of which is non-linear for generating harmonics with a frequency less than one terahertz for each of the optical waves generated by the dual-frequency optical source, detecting at least one harmonic for each of the optical waves generated by the dual-frequency optical source and transforming the harmonics detected into an electrical signal, it is possible to obtain signals comprising information representing the THz wave at much lower frequencies.

In addition, by varying the frequency of the reference electrical signal and/or the modulation frequency of the non-linear modulator, it is possible to vary the frequency of the THz wave while keeping a high spectral purity whatever the frequency of the THz wave.

The present invention thus makes it possible to obtain a THz wave generator with a variable frequency.

According to a particular embodiment of the invention, the oscillator further comprises means for filtering the optical signal delivered by the modulator. Thus it is possible to eliminate the two optical waves generated by the dual-frequency optical source that have a high intensity in comparison with the harmonics. The detection of the harmonics is then more precise.

According to a particular embodiment of the invention, the oscillator further comprises means for optically amplify the optical signal delivered by the modulator and/or means for optically amplify the optical signal delivered by the modulator and filtered.

Thus the detection of the harmonics is then more precise.

According to a particular embodiment of the invention, the dual-frequency optical source is a dual-frequency laser oscillating simultaneously on two modes and the controlled element of the dual-frequency optical source is an intra-cavity electro-optical material.

Thus it is possible to adjust, by means of an electrical voltage, the difference in optical frequency and consequently the beat at a frequency on the order of THz.

According to a particular embodiment of the invention, the dual-frequency optical source consists of two monomode lasers, and the element of the controlled dual-frequency optical source is one of the lasers the injection current of which is controlled or the temperature controller of which is controlled or the element of the controlled dual-frequency optical source is a piezoelectric module placed on one of the mirrors of said laser.

Thus it is possible to adjust, by means of an electrical voltage, the difference in optical frequency and consequently the beat at a frequency on the order of THz.

According to a particular embodiment of the invention, the oscillator further comprises means for filtering and/or amplifying and/or phase shifting the electrical signal resulting from the comparison.

Thus, only the signal issuing from the beat between the harmonics, for example the closest, is taken into account for the control.

According to a particular embodiment of the invention, the output of the dual-frequency optical source is connected to an antenna.

Thus, it is possible to convert the THz optical beat previously controlled into THz radiation of high spectral purity.

According to a particular embodiment of the invention, the electrical signal obtained by transformation of the detected harmonics is a beat signal.

A beat signal is a combination of two signals at different frequencies.

According to a particular embodiment of the invention, the modulator the transfer function of which is non-linear is a Mach-Zehnder modulator, a phase modulator, a semiconductor amplifier modulated at $F_{RF}$ via its injection current or via an optical beat, an optical resonator of the Fabry-Perot type comprising a phase or amplitude modulator or a ring optical resonator comprising a phase or amplitude modulator.

According to a particular embodiment of the invention, the oscillator further comprises a polariser for generating a beat of the optical waves.

BRIEF DESCRIPTION OF THE DRAWINGS

The features of the invention mentioned above, as well as others, will emerge more clearly from a reading of the following description of an example embodiment, said description being given in relation to the accompanying drawings, among which.

DETALED DESCRIPTION OF THE INVENTION

Figure 1:
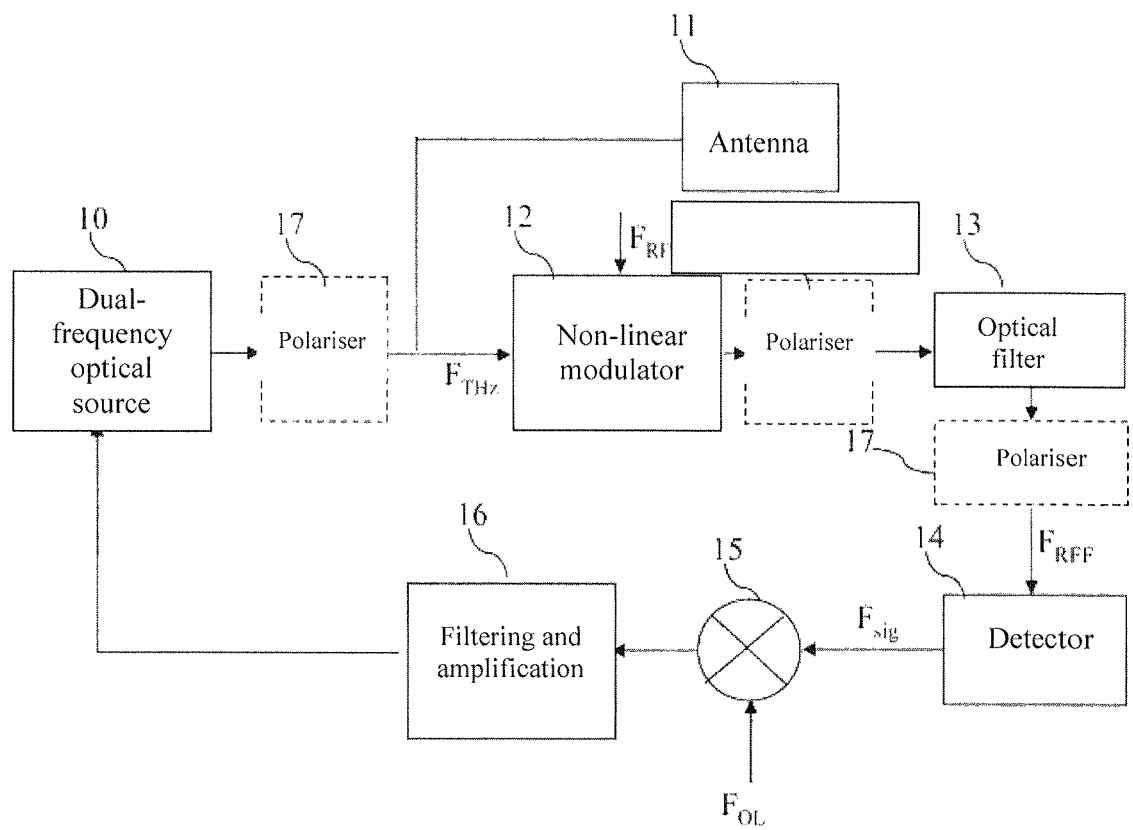
FIG. 1 shows a THz wave generator according to the present invention.

FIG. 1 shows a THz wave generator according to the present invention.

The THz wave generator comprises a dual-frequency optical source 10, an antenna 11, a non-linear modulator 12, an optical detector 14 and a phase servo-control of one of the frequencies of the optical source.

The dual-frequency optical source 10 generates two optical waves, the difference in frequency $F_{THz}$ of which is situated in the THz range. The dual-frequency optical source 10 consists for example of two monomode lasers or a mode-locking impulse laser from which two optical modes are taken and a dual-frequency laser oscillating simultaneously on two modes such as for example the laser described in the publication by M Alouini entitled "Dual tunable wavelength Er:Y-B:glass for THz beat frequency generation" published in the IEEE journal Photon. Technol. Lett. 10, 1554 (1998).

The dual-frequency optical source 10 will be described in more detail with reference to FIG. 2.

Figure 2:
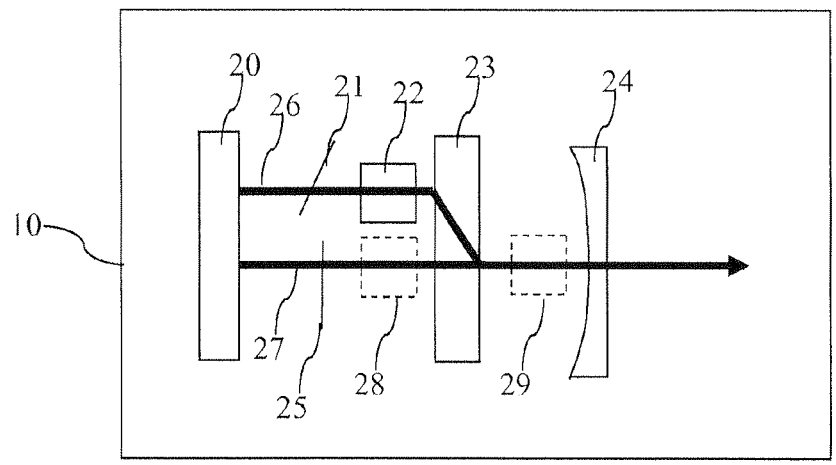
FIG. 2 shows an example of a dual-frequency optical source according to the present invention.

FIG. 2 shows an example of a dual-frequency optical source according to the present invention.

The dual-frequency optical source 20 oscillates on two orthogonal polarisation waves. The optical wave 26 of frequency $v_e$ passes through a standard 21 that guarantees the monomode oscillation and makes it possible to select the wavelength roughly. The optical wave 27 of frequency $v_o$ passes through a standard 25 that guarantees the monomode oscillation and makes it possible to select the wavelength roughly.

The two optical waves 26 and 27 are combined by a polarisation separator crystal 23. The laser oscillation of the two frequencies $v_o$ and $v_e$ takes place between the mirrors 20 and 24.

According to the invention, the dual-frequency optical source 10 comprises an electro-optical material 22 the electro-optical indices of which vary according to the electrical voltage that is applied thereto.

The electro-optical material is, according to a particular embodiment of the invention, an electro-optical crystal.

In a variant, the electro-optical material is electro-optical glass or electro-optical ceramic.

The electro-optical material 22 has for example the optical wave 26 of frequency $v_e$ pass through it.

In a variant, the electro-optical material 22 is placed in the areas 28 and 29 in broken lines in FIG. 1.

When the voltage applied to the electro-optical material 22 varies, the frequency of the optical wave passing through it varies.

The electro-optical material makes it possible to adjust an optical frequency finely according to the voltage that is applied thereto.

Figure 3:
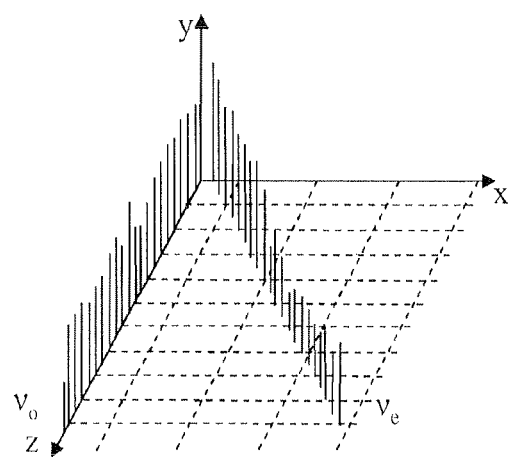
FIG. 3 shows an example of different wavelengths generated by the dual-frequency optical source according to the orientation of the standards included in the dual-frequency optical source.

FIG. 3 shows an example of different wavelengths generated by the dual frequency optical source according to the orientation of the standards included in the dual-frequency optical source.

In the example in FIG. 3, the frequency $v_e$ of the optical wave 26 varies according to the orientation of the standard 21.

The standards 21 and 25 make it possible to select wavelengths by jump of modes of c/2L: c being the speed of light and L the length of the cavity between the mirrors 20 and 24. The electro-optical material 22 for its part makes it possible to tune the range c/2L finely and continuously.

The x-axis represents the variations in frequencies while the y-axis represents the intensities of the optical waves 26 and 27.

The z-axis represents the change in the optical waves over time when the orientation of one of the standards is changed.

In the example in FIG. 3, the optical wave 26 of frequency $v_e$ passes through the standard 21 and the frequency thereof varies according the inclination of the standard 21 while the frequency $v_o$ of the optical wave 27 remains constant.

The output of the dual-frequency optical source 10 is connected to the antenna 11 and to the non-linear modulator 12 or, via a polariser 17, to the antenna 11 and to the non-linear modulator 12 when the dual-frequency optical source is like the one described with standard to FIG. 2.

The antenna 11 is a dipole or spiral antenna.

For example and non-limitatively, the antenna 11 is a metal pattern deposited on an AsGa-BT or InGaAs-BT semiconductor substrate. The optical beat generates in the semiconductor electrons with a life sufficiently short to follow the optical modulation envelope at the frequency THz.

The antenna can also function on the principle of optical rectification. In this case, the optical non-linearities are taken advantage of to generate the THz radiation.

The polariser 17 is shown in broken lines in FIG. 1.

The polariser 17 is a polariser with forty five degrees of the polarisation axes of the optical waves. The polariser 17 makes it possible to obtain a beat of the optical waves. The optical waves are projected onto the axis of the polariser 17 so that the two optical waves interfere and give a beat.

In the example in FIG. 1, the polariser 17 is placed at the output of the dual-frequency optical source.

In a variant, the polariser 17 is placed at the output of the non-linear modulator 12 or before the optical detector 14.

The non-linear modulator 12 is a device for modulating the intensity or phase of the dual-frequency wave at a radio or microwave frequency, for example at a frequency on the order of gigahertz, denoted $F_{RF}$.

The non-linear modulator 12 has an optical transfer function the non-linearity of which is very marked so as to generate a plurality of harmonics of the frequency $F_{RF}$.

The non-linear modulator 12 is for example a Mach-Zehnder modulator, a phase modulator, a semiconductor amplifier modulated at $F_{RF}$ via its injection current or via an optical beat, an optical resonator of the Fabry-Perot type comprising a phase or amplitude modulator, or a ring optical resonator comprising a phase or amplitude modulator.

Figure 4:
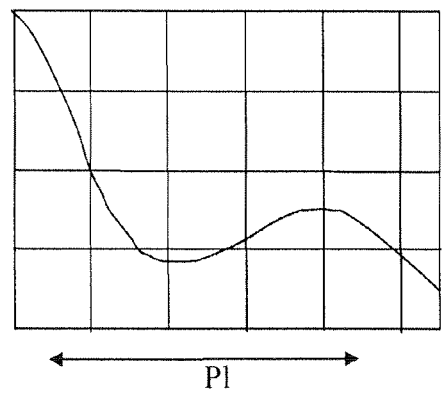
FIG. 4 is an example of a non-linear Mach-Zehnder modulator used in the present invention.

FIG. 4 is an example of a transfer function of a non-linear Mach-Zehnder modulator used in the present invention.

The x-axis represents the various modulation voltages applied to the non-linear modulator 12 and the y-axis represents the transmission of the optical signal. The range of variation in the modulation voltage is shown by the area P1 and comprises non-linearity areas.

Figure 5:
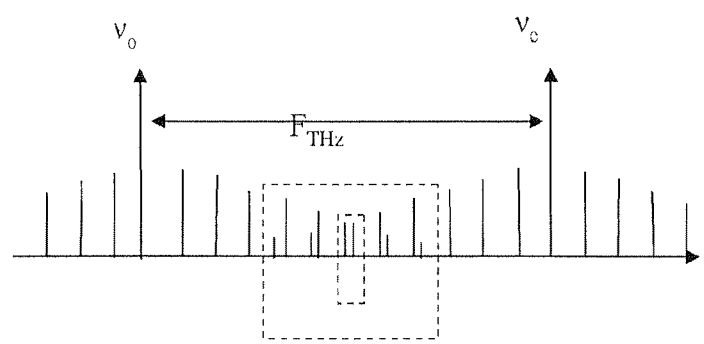
FIG. 5 shows the frequency spectrum at the output of the non-linear modulator.

FIG. 5 shows the frequency spectrum at the output of the non-linear modulator.

The non-linearity of the transfer function of the non-linear modulator 12 makes appear, in the optical spectrum on either side of the frequencies of the two waves $v_e$ and $v_o$, a multitude of harmonics at frequencies that are multiples of $F_{RF}$.

The output signal of the non-linear modulator 12 is converted into an electrical signal by an optical detector 14 such as a photodiode.

According a preferred embodiment of the invention, the output signal of the non-linear modulator 12 is filtered by an optical filter 13 so as to obtain at least one harmonic frequency issuing from the optical wave 27 of frequency $v_o$ and a harmonic frequency issuing from the optical wave 26 of frequency $v_e$.

It should be noted here that, in a variant embodiment of the present invention, the output signal of the non-linear modulator is amplified before being filtered and/or the output signal of the non-linear modulator 12 is amplified after having been filtered.

The squares in broken lines in FIG. 5 show two examples of harmonics that are filtered and converted into an electrical signal by the optical detector 14.

Two harmonics have respective frequencies equal to $v_m = v_o + mF_{RF}$ and $v_n = v_e - nF_{RF}$ where m and n are two integers.

It should be noted here that the modulation frequency $F_{RF}$ is chosen so that $F_{SIG} = v_n - v_m$ is situated in a frequency range lying between a few kilohertz and a few gigahertz.

The beat of these at least two frequencies is then converted into an electrical signal $F_{SIG}$ that is compared by a phase comparator 15 with a local oscillator $F_{OL}$ the frequency of which is between a few tens of kilohertz and few gigahertz.

The result of the comparison represents the phase error of the THz wave.

The result of the comparison is then preferentially filtered and/or amplified and/or phase shifted by a filtering and amplification module 16 in order then to be applied to the electro-optical material 22.

It should be noted here that, if the dual-frequency optical source consists of two monomode lasers, the result of the filtered and/or amplified and/or phase-shifted comparison is transferred to one of the lasers via its injection current or its temperature controller or via a piezoelectric module placed on one of the mirrors of the laser.

Naturally the present invention is in no way limited to the embodiments described here but quite the contrary encompasses any variant within the capability of a person skilled in the art and particularly the combination of different embodiments of the present invention.

The invention claimed is:

1. Oscillator generating a wave composed of a frequency of on the order of terahertz from a beat of two optical waves generated by a dual-frequency optical source, wherein the oscillator comprises:

a modulator the transfer function of which is non-linear for generating harmonics with a frequency of less than one terahertz for each of the optical waves generated by the dual-frequency optical source by modulating the optical waves generated by the dual-frequency optical source by a radio or micro wave frequency, an optical detector able to detect at least one harmonic for each of the optical waves generated by the dual-frequency optical source and to transform the harmonics detected into a beat signal, a phase comparator for comparing the beat signal with a reference beat signal, circuitry causing the oscillator to perform controlling at least one element of the dual-frequency optical source with a signal obtained from the signal resulting from the comparison.

2. Oscillator according to claim 1, further comprising circuitry causing the oscillator to perform filtering the optical signal delivered by the modulator.

3. Oscillator according to claim 1, further comprising circuitry causing the oscillator to perform optically amplifying an optical signal delivered by the modulator.

4. Oscillator according to claim 1, further comprising circuitry causing the oscillator to perform amplifying an optical signal delivered by the modulator and filtered.

5. Oscillator according to claim 1, wherein the dual-frequency optical source is a dual-frequency laser oscillating simultaneously on two modes and the controlled element of the dual-frequency optical source is an intra-cavity electro-optical material.

6. Oscillator according to claim 1, wherein the dual-frequency optical source consists of two monomode lasers the element of the controlled dual-frequency optical source is one of the lasers, the injection current of which or the temperature controller of which is controlled.

7. Oscillator according to claim 1, wherein the output of the dual-frequency optical source is connected to an antenna.

8. Oscillator according to claim 1, wherein the modulator the transfer function of which is non-linear is a Mach-Zehnder modulator, a phase modulator, a semiconductor amplifier modulated at FRF via its injection current or via an optical beat, an optical resonator of the Fabry-Perot type comprising a phase or amplitude modulator, or a ring optical resonator comprising a phase or amplitude modulator.

9. Oscillator according to claim 1, wherein the oscillator further comprises a polariser for generating a beat of the optical waves.

10. Oscillator according to claim 1, further comprising circuitry causing the oscillator to perform filtering the beat signal resulting from the comparison.

11. Oscillator according to claim 1, further comprising circuitry causing the oscillator to perform amplifying the beat signal resulting from the comparison.

12. Oscillator according to claim 1, further comprising circuitry causing the oscillator to perform phase shifting the beat signal resulting from the comparison.

13. Oscillator according to claim 1, wherein the controlled element of the dual-frequency optical source is a piezoelectric module placed on one of the mirrors of one laser.

* * * * *